United States Patent
Mao et al.

(10) Patent No.: US 12,252,805 B2
(45) Date of Patent: Mar. 18, 2025

(54) SINGLE CRYSTAL PULLING APPARATUS HOT-ZONE STRUCTURE, SINGLE CRYSTAL PULLING APPARATUS AND CRYSTAL INGOT

(71) Applicants: Xi'an ESWIN Material Technology Co., Ltd., Xi'an (CN); Xi'an ESWIN Silicon Wafer Technology Co., Ltd., Xi'an (CN)

(72) Inventors: Qinhu Mao, Xi'an (CN); Bokcheol Sim, Xi'an (CN); Jinkun Kim, Xi'an (CN)

(73) Assignees: XI'AN ESWIN MATERIAL TECHNOLOGY CO., LTD., Xi'an (CN); XI'AN ESWIN SILICON WAFER TECHNOLOGY CO., LTD., Xi'an (CN)

( * ) Notice: Subject to any disclaimer, the term of this patent is extended or adjusted under 35 U.S.C. 154(b) by 471 days.

(21) Appl. No.: 17/603,928

(22) PCT Filed: May 11, 2021

(86) PCT No.: PCT/CN2021/093007
§ 371 (c)(1),
(2) Date: Oct. 14, 2021

(87) PCT Pub. No.: WO2021/244234
PCT Pub. Date: Dec. 9, 2021

(65) Prior Publication Data
US 2022/0307156 A1    Sep. 29, 2022

(30) Foreign Application Priority Data
Jun. 5, 2020    (CN) .......................... 202010505348.1

(51) Int. Cl.
*C30B 15/14*    (2006.01)
*C30B 29/06*    (2006.01)

(52) U.S. Cl.
CPC .............. *C30B 15/14* (2013.01); *C30B 29/06* (2013.01); *Y10T 117/1068* (2015.01)

(58) Field of Classification Search
CPC ..................................................... C30B 29/06
See application file for complete search history.

(56) References Cited

U.S. PATENT DOCUMENTS

| | | | | |
|---|---|---|---|---|
| 5,746,824 | A | * 5/1998 | Nemetz | .................. C30B 15/14 117/13 |
| 2008/0110394 | A1 | * 5/2008 | Noda | ...................... C30B 15/00 117/88 |
| 2016/0115032 | A1 | * 4/2016 | Wodtke | ................. C01B 32/188 205/291 |
| 2018/0290093 | A1 | 10/2018 | Brinkman et al. | |

(Continued)

FOREIGN PATENT DOCUMENTS

| | | |
|---|---|---|
| CN | 109594122 A | 4/2019 |
| CN | 110029394 A | 7/2019 |

(Continued)

OTHER PUBLICATIONS

Korean Office Action corresponding to Korean Application No. 10-2021-7035390, dated May 31, 2023. (5 pages).

(Continued)

*Primary Examiner* — Hua Qi
(74) *Attorney, Agent, or Firm* — Maginot, Moore & Beck LLP

(57) ABSTRACT

The present disclosure provides a single crystal pulling apparatus Hot-Zone structure, a single crystal pulling apparatus and a crystal ingot. The single crystal pulling apparatus Hot-Zone structure is applied to a single crystal pulling apparatus. The single crystal pulling apparatus includes a puller body and a crucible provided in the center of the puller body. The single crystal pulling apparatus Hot-Zone structure includes: a side heater provided in a periphery of (Continued)

the crucible, and a diversion assembly provided between the side heater and the crucible, and configured to form a gas flow passage with an outer wall of the crucible, to discharge a gas to the outside of the puller body.

16 Claims, 2 Drawing Sheets

(56) References Cited

U.S. PATENT DOCUMENTS

| | | | |
|---|---|---|---|
| 2019/0064098 A1* | 2/2019 | Eriguchi | ............... C30B 29/06 |
| 2020/0149185 A1 | 5/2020 | Shen et al. | |
| 2021/0071314 A1 | 3/2021 | Shen et al. | |
| 2021/0071316 A1 | 3/2021 | Shen et al. | |

FOREIGN PATENT DOCUMENTS

| | | | | |
|---|---|---|---|---|
| CN | 110592660 A | | 12/2019 | |
| CN | 110592661 A | * | 12/2019 | ............ C30B 15/00 |
| DE | 102015213474 A1 | | 9/2015 | |
| DE | 102020128225 A1 | | 4/2021 | |
| JP | H0214898 A | * | 1/1990 | |
| JP | H1081596 A | | 3/1998 | |
| JP | H11116389 A | | 4/1999 | |
| JP | 2002097098 A | | 4/2002 | |
| JP | 2018531868 A | | 11/2018 | |
| JP | 2020038874 A | | 3/2020 | |
| KR | 10-1998-0009529 A | | 4/1998 | |
| KR | 980009529 A | | 4/1998 | |
| KR | 20100057233 A | * | 5/2010 | |
| KR | 20180005424 A | | 1/2018 | |
| TW | 476816 B | | 2/2002 | |
| TW | 202018133 A | | 5/2020 | |

OTHER PUBLICATIONS

Machine Translation of Korean Office Action corresponding to Korean Application No. 10-2021-7035390, dated May 31, 2023. (5 pages).
Japanese Office Action corresponding to Japanese Application No. 2022-542035, dated Aug. 8, 2023. (3 pages).
Machine Translation of Japanese Office Action corresponding to Japanese Application No. 2022-542035, dated Aug. 8, 2023. (4 pages).
Machine Translation of KR1019980009529. (5 Pages).
Machine Translation of JPJP2002097098A. (23 Pages).
Machine Translation of JPH11116389A. (10 Pages).
Written Opinion of the International Search Authority corresponding to International Application No. PCT/CN2021/093007, dated Jun. 28, 2021. (9 pages).
Machine Translation of Written Opinion of the International Search Authority corresponding to International Application No. PCT/CN2021/093007, dated Jun. 28, 2021. (5 pages).
Taiwanese Office Action and the Written Opinion of the International Search Authority corresponding to Chinese Application No. CN110118757A, dated Oct. 29, 2021. (7 Pages).
Machine Translation of Taiwanese Office Action and the Written Opinion of the International Search Authority corresponding to Chinese Application No. CN110118757A, dated Oct. 29, 2021. (3 Pages).
Machine Translation of CN109594122A. (16 Pages).
Machine Translation of CN110029394A. (12 Pages).
Machine Translation of JPH0214898A. (4 Pages).
Korean Notice of Third-Party Observation corresponding to Korean Application No. 10-2021-7035390, dated Aug. 9, 2022. (2 pages).
Machine Translation of Korean Notice of Third-Party Observation corresponding to Korean Application No. 10-2021-7035390, dated Aug. 9, 2022. (2 pages).
Machine Translation of KR20180005424A. (26 Pages).
Machine Translation of JP2020038874A. (21 Pages).
German Office Action corresponding to German Application No. 11 2021 000 041.1, dated Sep. 14, 2023. (10 pages).
English Translation of German Office Action corresponding to German Application No. 11 2021 000 041.1, dated Sep. 14, 2023. (11 pages).
Machine Translation of DE102015213474A1. (7 Pages).
Machine Translation of DE102020128225A1. (12 Pages).
Machine Translation of JPH11116389A. (6 Pages).

* cited by examiner

SINGLE CRYSTAL PULLING APPARATUS HOT-ZONE STRUCTURE, SINGLE CRYSTAL PULLING APPARATUS AND CRYSTAL INGOT

CROSS-REFERENCE TO RELATED APPLICATION

This present application is a U.S. national phase of PCT Application No. PCT/CN2021/093007 filed on May 11, 2021, which claims the priority of Chinese Application No. 202010505348.1 filed Jun. 5, 2020, both disclosures of which are incorporated herein by reference in their entireties.

TECHNICAL FIELD

The present disclosure relates to the field of crystal ingot manufacturing technologies, and in particular to a single crystal pulling apparatus Hot-Zone structure, a single crystal pulling apparatus and a crystal ingot.

BACKGROUND

In a growing process of a single crystal silicon material, especially in a growing process of the single crystal silicon material in a single crystal pulling apparatus by using a czochralski method, a graphite Hot-Zone is usually used to provide controls of growth temperature, temperature gradient, etc. Specifically, a polycrystalline raw material is melted in a low vacuum and inert gas environment, and then is in contact with a seed, and a single crystal material is growing along with the rotating and lifting of the seed, where the heat needed in this process mainly comes from a graphite heater. However, since splashing of a silicon liquid occurs during recharging and silicon monoxide (SiO) escaping from a surface of the silicon liquid at a high temperature and flowing with the airflow in the single crystal pulling apparatus reacts with the graphite heater after it comes into contact with the graphite heater, on the one hand, silicon carbide (SiC) deposition will be formed on a surface of the heater, on the other hand, due to the chemical reaction, a thickness of the heater may gradually decrease with the increase of the number of uses, which directly leads to a change in material properties of the heater surface and a change in the thickness of the heater, thereby to lead to a problem such as a decrease of the heating performance of the heater, eventually reduce the service life of the heater and adversely affect the quality of the product.

SUMMARY

In view of this, the present disclosure provides a single crystal pulling apparatus Hot-Zone structure, a single crystal pulling apparatus and a crystal ingot, so as to solve a problem in the related art that a gas mixed with harmful impurities in the single crystal pulling apparatus causes damage to a heater and then adversely affects the heater service life and even the quality of manufactured products.

To solve the above technical problems, the technical solutions of the present disclosure are as follows.

In one aspect, the embodiments of the present disclosure provides a single crystal pulling apparatus Hot-Zone structure, including: a side heater provided in a periphery of the crucible; and a diversion assembly surrounding the crucible and arranged between the side heater and a side wall of the crucible and below the crucible, and configured to form a gas flow passage with an outer wall of the crucible, the gas flow passage being connected to the outside of the puller body to discharge a gas to the outside of the puller body.

Optionally, the diversion assembly includes a side heat conduction cylinder, a bottom heat conduction plate and an exhaust cylinder, the side heat conduction cylinder is provided between the side heater and the crucible, the bottom heat conduction plate is provided below the crucible, a bottom end of the side heat conduction cylinder is connected to the bottom heat conduction plate in a sealed manner, at least one exhaust hole is provided in the bottom heat conduction plate, the exhaust cylinder is provided through the exhaust hole, one end of the exhaust cylinder is connected to the gas flow passage, and the other end of the exhaust cylinder extends to the outside of the puller body.

Optionally, the single crystal pulling apparatus Hot-Zone structure further includes: a bottom heater provided under the bottom heat conduction plate.

Optionally, the number of exhaust holes is four, four exhaust holes are spaced apart from each other at a same circumference, and one of exhaust cylinders is provided in each exhaust hole.

Optionally, the side heat conduction cylinder and the bottom heat conduction plate are each made of a graphite-based material.

Optionally, the graphite-based material is graphene.

Optionally, the single crystal pulling apparatus Hot-Zone structure further includes: a vacuum pump connected to the end of the puller body extending to the outside of the puller body, and configured to extract the gas in the gas flow passage.

Optionally, the single crystal pulling apparatus Hot-Zone structure further includes: a filtering device provided between the exhaust cylinder and the vacuum pump, and configured to filter impurity particles in the gas.

Optionally, the single crystal pulling apparatus Hot-Zone structure further includes: a side heat insulation material layer provided between the side heater and an inner side wall of the puller body; and a bottom heat insulation material layer provided between the bottom heater and a bottom wall of the puller body.

Optionally, the single crystal pulling apparatus Hot-Zone structure further includes: a heat shield provided above the crucible.

In another aspect, the embodiments of the present disclosure further provide a single crystal pulling apparatus including a puller body, a crucible provided in the center of the puller body and the single crystal pulling apparatus Hot-Zone structure as described above.

In yet another aspect, the embodiments of the present disclosure further provide a crystal ingot. The crystal ingot is manufactured by using the single crystal pulling apparatus as described above.

The beneficial effects of the above technical solutions of the present disclosure are as follows.

According to the single crystal pulling apparatus Hot-Zone structure of the present disclosure, the gas flowing into the single crystal pulling apparatus may be guided by the formed gas flow passage to be discharged to the outside of the single crystal pulling apparatus, so as to isolate and protect the heater in the single crystal pulling apparatus, prevent the heater from being damaged by silicon monoxide carried in the gas, thereby to prolong the service life of the heater in the single crystal pulling apparatus and ensure the normal operation of the heater.

DETAILED DESCRIPTION

In order to make the objects, the technical solutions and the advantages of the embodiments of the present disclosure more apparent, the embodiments of the present disclosure will be described hereinafter in a clear and complete manner in conjunction with the drawings of the embodiments of the present disclosure. Obviously, the following embodiments merely relate to a part of, rather than all of, the embodiments of the present disclosure. All other embodiments obtained by a person of ordinary skill in the art based on the described embodiments of the present disclosure, shall fall within the scope of the present disclosure.

In a growing process of a single crystal silicon material, especially in a growing process of the single crystal silicon material in a single crystal pulling apparatus by using a czochralski method, a graphite Hot-Zone is usually used to provide controls of growth temperature, temperature gradient, etc. Specifically, a polycrystalline raw material is melted in a low vacuum and inert gas environment, and then is in contact with a seed, and a single crystal material is growing along with the rotating and lifting of the seed, where, the heat needed in this process mainly comes from a graphite heater. However, since splashing of a silicon liquid occurs during a recharging and silicon monoxide (SiO) escaping from a surface of the silicon liquid at a high temperature and flowing with the airflow in the single crystal pulling apparatus reacts with the graphite heater after it comes into contact with the graphite heater, on the one hand, silicon carbide (SiC) deposition will be formed on a surface of the heater, on the other hand, due to the chemical reaction, a thickness of the heater may gradually decrease with the increase of the number of uses, which directly leads to a change in material properties of the heater surface and a change in the thickness of the heater, thereby to lead to a problem such as a decrease of the heating performance of the heater, eventually reduce the service life of the heater and adversely affect the quality of the product.

In order to avoid the above problems, in the related art, an exhaust hole is provided in an upper position of a side heat insulation cylinder, so that a gas does not flow through a side heater and a bottom Hot-Zone component, thereby to protect the heater and a lower Hot-Zone. However, a specific implementation of this method is extremely complex. On the one hand, the design of the side exhaust hole may greatly increase the number of types of Hot-Zone components and the design difficulty, which directly leads to an increase in cost. In addition, in the case where this structure is used, the airflow carried the silicon monoxide may crystallize on Hot-Zone components above the liquid surface, and once a crystallization falls into the melt, it may directly cause a crystal to lose its single crystal characteristics, resulting in a product waste.

Figure 1:
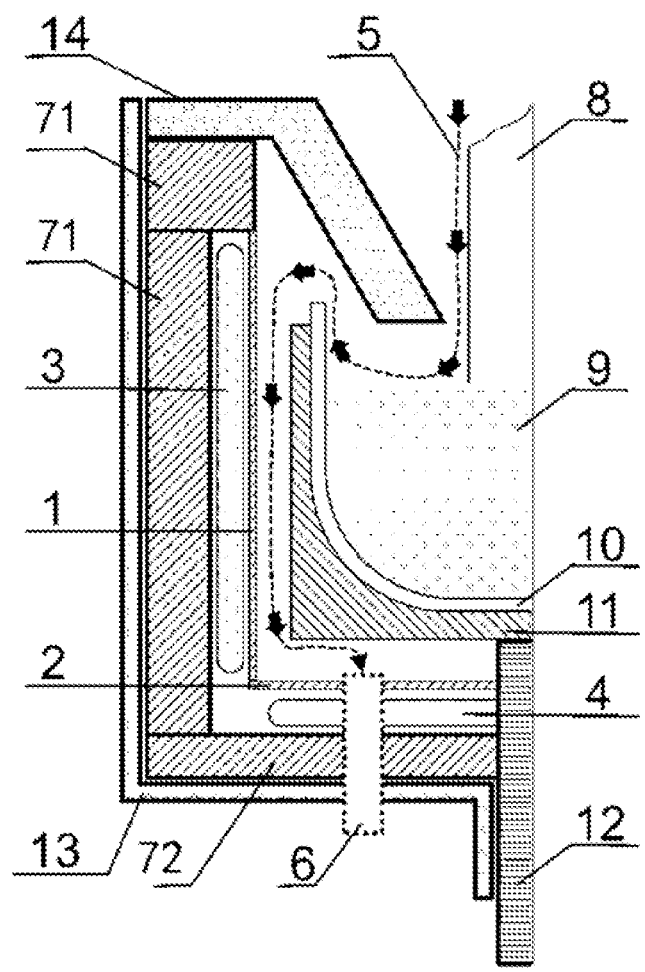
FIG. 1 is a schematic view showing a single crystal pulling apparatus according to an embodiment of the disclosure.

Therefore, the embodiments of the present disclosure provide a single crystal pulling apparatus Hot-Zone structure. As shown in FIG. 1, the single crystal pulling apparatus Hot-Zone structure is applied to a single crystal pulling apparatus including a puller body 13 and a crucible provided in the center of the puller body 13, the single crystal pulling apparatus Hot-Zone structure may include: a side heater 3 and a diversion assembly. The side heater 3 is provided in a periphery of the crucible, that is, between an inner wall of the puller body 13 and the crucible, and is used to heat the crucible from the outside of the crucible. The diversion assembly is enclosed between the side heater 3 and a side wall of the crucible and below the crucible, and configured to form a gas flow passage with an outer wall of the crucible, the gas flow passage is connected to the outside of the puller body to discharge a gas to the outside of the puller body 13. In other words, the diversion assembly and the outer wall of the crucible form the gas flow passage. When the gas is introduced into the single crystal pulling apparatus, the gas may be discharged to the outside of the puller body 13 through the gas flow passage, so that the diversion assembly isolates the side heater 3 to prevent the side heater 3 from being damaged by harmful substances such as silicon monoxide carried in the gas.

In the embodiments of the present disclosure, the diversion assembly may include a side heat conduction cylinder 1, a bottom heat conduction plate 2 and an exhaust cylinder 6. The side heat conduction cylinder 1 is provided between the side heater 3 and the crucible, that is, the side heat conduction cylinder 1 is provided in the periphery of the crucible, the bottom heat conduction plate 2 is provided below the crucible, a bottom end of the side heat conduction cylinder 1 is connected to the bottom heat conduction plate 2 in a sealed manner, at least one exhaust hole is provided in the bottom heat conduction plate 2, and the exhaust cylinder 6 is provided through the exhaust hole, one end of the exhaust cylinder 6 is connected to the gas flow passage, and the other end of the exhaust cylinder extends to the outside of the puller body 13. In other words, the gas flow passage is formed among the side heat conduction cylinder 1, the bottom heat conduction plate 2 and the outer wall of the crucible. Since the side heater 3 is located in the periphery of the side heat conduction cylinder 1, the gas flow passage and the side heater 3 are located on both sides of the side heat conduction cylinder 1 respectively, and are isolated by the side heat conduction cylinder 1, and the bottom heat conduction plate 2 is provided with the exhaust hole. When the exhaust cylinder 6 is provided through the exhaust hole, the gas flow passage is connected to the outside of the puller body 13, so as to discharge the gas to the outside of the puller body 13 from the gas flow passage smoothly.

In the embodiments of the present disclosure, the single crystal pulling apparatus Hot-Zone structure further includes a bottom heater 4, which is used to heat the crucible from the bottom of the crucible, and the bottom heater 4 is provided under the bottom heat conduction plate 2. Therefore, the gas flow passage and the bottom heater 4 are located on both sides of the bottom heat conduction plate 2 respectively and are isolated by the bottom heat conduction plate 2, so as to prevent the bottom heater 4 from being damaged by the harmful substances such as silicon monoxide carried in the gas.

In the embodiments of the present disclosure, the number of exhaust holes provided in the bottom heat conduction plate 2 may be four, four exhaust holes are spaced apart from each other at a same circumference, and one of exhaust cylinders 6 is provided in each exhaust hole. Thus, the gas in the gas flow passage may be discharged to the outside of the puller body 13 quickly and efficiently through the four exhaust cylinders 6. Of course, according to different requirements, the number of exhaust holes may be increased or decreased.

Figure 2:
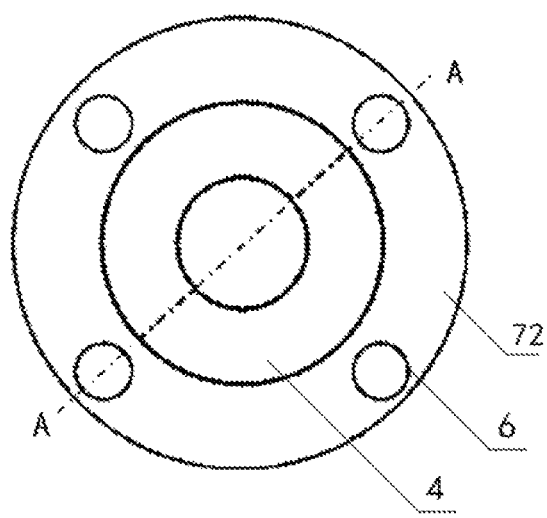
FIG. 2 is a schematic view showing an arrangement relationship between a bottom heater and an exhaust cylinder according to an embodiment of the present disclosure.
Figure 3:
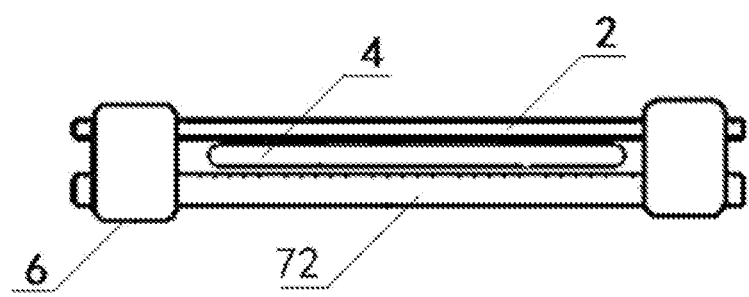
FIG. 3 is a sectional view of the bottom heater and the exhaust cylinder in FIG. 2 along line A-A.

As shown in FIGS. 2 and 3, the exhaust cylinder 6 needs to pass through a plane where the bottom heater 4 is located. A specific arrangement depends on an actual shape and structure of the bottom heater 4. For example, when a heating area of the bottom heater 4 is relatively small, the exhaust cylinder 6 may be provided in the periphery of the bottom heater 4, and when the heating area of the bottom heater 4 is relatively large, an exhaust hole needs to be provided in the bottom heater 4, so that the exhaust cylinder 6 may pass through the exhaust hole.

In some embodiments of the present disclosure, the side heat conduction cylinder 1 and the bottom heat conduction plate 2 are each made of a graphite-based material. The graphite-based material should have a high thermal conductivity, usually the thermal conductivity may reach 1500 W/MK, so as to ensure that the heat generated when the side heater 3 and the bottom heater 4 operate may quickly pass through the side heat conduction cylinder 1 and the bottom heat conduction plate 2 and reach the crucible, prevent a heating efficiency and heating capacity of the side heater 3 and the bottom heater 4 from being affected, and prevent a distribution of the heat field generated by the side heater 3 and the bottom heater 4 from being affected. The graphite-based material is resistant to high temperature and resistant to corrosion, has stable chemical properties, may adapt to a high temperature scenario in the single crystal pulling apparatus and has a long service life. In the embodiments of the present disclosure, the graphite-based material may include graphene, and graphene has very good heat conduction performance.

In some embodiments of the present disclosure, the single crystal pulling apparatus Hot-Zone structure further includes a vacuum pump (not shown in the figure), and the vacuum pump is connected to the end of the exhaust cylinder 6 extending to the outside of the puller body. The vacuum pump is configured to extract the gas in the gas flow passage by providing a negative pressure at one end of the exhaust cylinder 6, so as to ensure that the gas in the puller body 13 is quickly guided out of the puller body 13.

In some other embodiments of the present disclosure, the single crystal pulling apparatus Hot-Zone structure further includes a filtering device (not shown in the figure), and the filtering device is provided between the exhaust cylinder 6 and the vacuum pump, and configured to filter impurity particles in the flowing gas, so as to avoid pollution.

In some embodiments of the present disclosure, the single crystal pulling apparatus Hot-Zone structure further includes: a side heat insulation material layer 71 and a bottom heat insulation material layer 72, the side heat insulation material layer 71 is provided between the side heater 3 and an inner side wall of the puller body 13, and the bottom heat insulation material layer 72 is provided between the bottom heater 4 and a bottom wall of the puller body 13. A good thermal insulation effect may be achieved by providing the side thermal insulation material layer 71 and the bottom thermal insulation material layer 72, so as to prevent the heat in the puller body 13 from leaking to the outside. In FIG. 1, the uppermost side heat insulation material layer 71 also plays a role in blocking the gas in the single crystal pulling apparatus. In fact, a length of the side heat conduction cylinder 1 may be appropriately increased, so as to isolate and protect the side heat insulation material layer 71 as well.

As shown in FIG. 1, in some embodiments of the present disclosure, the single crystal pulling apparatus Hot-Zone structure further includes a heat shield 14 provided above the crucible, and the crucible includes a graphite crucible 11 and a quartz crucible 10 provided in the graphite crucible 11, a bottom of the graphite crucible 11 is connected to a crucible shaft 12, and the crucible shaft 12 is used to drive the crucible to rotate, so that the inside of the crucible is heated evenly. In a single crystal ingot manufacturing process, after a silicon material is heated in the quartz crucible 10 to obtain a polycrystalline silicon melt 9, a single crystal is growing along with the lifting of the seed, so as to obtain a crystal ingot 8. In the process of lifting the seed, it is necessary to supply an inert gas into a gap between the crystal ingot 8 and the heat shield 14. As shown by an air flow trajectory 5 in the figure, the inert gas flows to a solid-liquid interface under the diversion action of the heat shield 14, so as to control a temperature of the solid-liquid interface. Then it flows into the gas flow passage, and finally flows out of the single crystal pulling apparatus from the bottom of the puller body 13 through the exhaust cylinder 6. As a result, even if the inert gas is mixed with harmful substances such as silicon monoxide, due to the existence of the diversion assembly, the side heater 3 and the bottom heater 4 are well insulated and protected, thereby avoiding the damage of the side heater 3 and the bottom heater 4 by silicon monoxide, improving the service life of the side heater 3 and the bottom heater 4. In addition, it is able to avoid a process instability due to changes in surface properties and thicknesses of the side heater 3 and the bottom heater 4 and prevent the problem of affecting product quality. It may further prevent the melt from splashing to the surfaces of the side heater 3 and the bottom heater 4 during the recharging process. In addition, due to the formed gas flow passage, a regular pattern of the gas flow in the single crystal pulling apparatus is controllable, so as to facilitate effective management on the temperature of the solid-liquid interface through inert gas.

In another aspect, the embodiments of the present disclosure further provide a single crystal pulling apparatus including a puller body, a crucible provided in the center of the puller body and the single crystal pulling apparatus Hot-Zone structure as described above. According to the single crystal pulling apparatus Hot-Zone structure of the present disclosure, the gas flowing into the single crystal pulling apparatus may be guided by the formed gas flow passage to be discharged to the outside of the single crystal pulling apparatus, so as to isolate and protect the heater in the single crystal pulling apparatus, prevent the heater from being damaged by silicon monoxide carried in the gas, thereby to prolong the service life of the heater in the single crystal pulling apparatus and ensure the normal operation of the heater. Therefore, the single crystal pulling apparatus in the embodiments of the present disclosure also has the above-mentioned beneficial effects, and in order to avoid repetition, it is not particularly defined herein.

The present disclosure further provides a crystal ingot that is manufactured by using the single crystal pulling apparatus as described above. The crystal ingot manufactured by using the above single crystal pulling apparatus has higher quality and fewer defects.

The foregoing descriptions are optional implementations of the present disclosure. It should be appreciated that persons of ordinary skill in the art may make various improvements or modifications without departing from the principle of the present disclosure and the improvements and modifications shall fall within the protection scope of the present disclosure.

What is claimed is:

1. A single crystal pulling apparatus Hot-Zone structure applied to a single crystal pulling apparatus comprising a puller body and a crucible provided in a center of the puller body, and comprising:
    a side heater provided in a periphery of the crucible; and
    a diversion assembly enclosed between the side heater and a side wall of the crucible and below the crucible, the diversion assembly configured to form a gas flow passage with an outer wall of the crucible, the gas flow passage being connected to outside of the puller body to discharge a gas to the outside of the puller body;
    wherein:
        the diversion assembly comprises a side heat conduction cylinder, a bottom heat conduction plate and an exhaust cylinder, the side heat conduction cylinder provided between the side heater and the crucible and surrounding the side wall of the crucible, the bottom heat conduction plate provided below the crucible, and a bottom end of the side heat conduction cylinder connected to the bottom heat conduction plate in a sealed manner,
        at least one exhaust hole is provided in the bottom heat conduction plate, and
        the exhaust cylinder is provided through the exhaust hole, one end of the exhaust cylinder connected to the gas flow passage, and the other end of the exhaust cylinder extending to the outside of the puller body;
    wherein the single crystal pulling apparatus Hot-Zone structure further comprises a bottom heater provided below the bottom heat conduction plate;
    wherein the at least one exhaust hole is arranged in the bottom heater;
    wherein the single crystal pulling apparatus Hot-Zone structure further comprises a side heat insulation material layer provided between the side heater and an inner side wall of the puller body, and a bottom heat insulation material layer provided between the bottom heater and a bottom wall of the puller body; and
    wherein the side heat insulation material layer comprises a first part above the side heater and a second part, and an orthographic projection of the first part onto the bottom heat insulation material layer covers an orthographic projection of the side heater onto the bottom heat insulation material layer, and does not overlap an orthographic projection of the crucible onto the bottom heat insulation material layer;
    wherein in each exhaust hole, the exhaust cylinder sequentially passes through the bottom heat conduction plate, the bottom heater, the bottom heat insulation material layer and the puller body.

2. The single crystal pulling apparatus Hot-Zone structure according to claim 1, wherein the at least one exhaust hole comprises four exhaust holes spaced apart from each other in the bottom heater at a same circumference, and one of a plurality of exhaust cylinders is provided in each exhaust hole.

3. The single crystal pulling apparatus Hot-Zone structure according to claim 1, wherein each of the side heat conduction cylinder and the bottom heat conduction plate are made of a graphite-based material.

4. The single crystal pulling apparatus Hot-Zone structure according to claim 3, wherein the graphite-based material comprises graphene.

5. The single crystal pulling apparatus Hot-Zone structure according to claim 1, further comprising:
    a vacuum pump connected to an end of the puller body extending to the outside of the puller body, the vacuum pump configured to extract the gas in the gas flow passage.

6. The single crystal pulling apparatus Hot-Zone structure according to claim 5, further comprising:
    a filtering device provided between the exhaust cylinder and the vacuum pump, and configured to filter impurity particles in the gas.

7. The single crystal pulling apparatus Hot-Zone structure according to claim 1, further comprising:
    a heat shield provided above the crucible.

8. The single crystal pulling apparatus Hot-Zone structure according to claim 1, wherein the side heater is spaced apart from the bottom heater.

9. The single crystal pulling apparatus Hot-Zone structure according to claim 1, wherein the side heater and the bottom heater are arranged in a space formed by the side heat conduction cylinder, the bottom heat conduction plate, the side heat insulation material layer and the bottom heat insulation material layer, and the space is isolated from the outside of the puller body.

10. A single crystal pulling apparatus, comprising a puller body, a crucible provided in a center of the puller body and a single crystal pulling apparatus Hot-Zone structure, wherein the single crystal pulling apparatus Hot-Zone Structure comprises:
    a side heater provided in a periphery of the crucible; and
    a diversion assembly enclosed between the side heater and a side wall of the crucible and below the crucible, the diversion assembly configured to form a gas flow passage with an outer wall of the crucible, the gas flow passage being connected to outside of the puller body to discharge a gas to the outside of the puller body;
    wherein:
        the diversion assembly comprises a side heat conduction cylinder, a bottom heat conduction plate and an exhaust cylinder, the side heat conduction cylinder provided between the side heater and the crucible and surrounding the side wall of the crucible, the bottom heat conduction plate provided below the crucible, and a bottom end of the side heat conduction cylinder connected to the bottom heat conduction plate in a sealed manner,
        at least one exhaust hole is provided in the bottom heat conduction plate, and
        the exhaust cylinder is provided through the exhaust hole, one end of the exhaust cylinder connected to the gas flow passage, and the other end of the exhaust cylinder extending to the outside of the puller body;
    wherein the single crystal pulling apparatus Hot-Zone structure further comprises a bottom heater provided below the bottom heat conduction plate;
    wherein the at least one exhaust hole is arranged in the bottom heater;
    wherein the single crystal pulling apparatus Hot-Zone structure further comprises a side heat insulation material layer provided between the side heater and an inner side wall of the puller body, and a bottom heat insulation material layer provided between the bottom heater and a bottom wall of the puller body;
    wherein the side heat insulation material layer comprises a first part above the side heater and a second part, and an orthographic projection of the first part onto the bottom heat insulation material layer covers an orthographic projection of the side heater onto the bottom heat insulation material layer, and does not overlap an orthographic projection of the crucible onto the bottom heat insulation material layer;

wherein in each exhaust hole, the exhaust cylinder sequentially passes through the bottom heat conduction plate, the bottom heater, the bottom heat insulation material layer and the puller body.

11. The single crystal pulling apparatus according to claim 10, wherein the at least one exhaust hole comprises four exhaust holes spaced apart from each other in the bottom heater at a same circumference, and one of a plurality of exhaust cylinders is provided in each exhaust hole.

12. The single crystal pulling apparatus according to claim 10, wherein each of the side heat conduction cylinder and the bottom heat conduction plate are made of a graphite-based material.

13. The single crystal pulling apparatus according to claim 12, wherein the graphite-based material comprises graphene.

14. The single crystal pulling apparatus according to claim 10, wherein the single crystal pulling apparatus Hot-Zone structure further comprises:

a vacuum pump connected to an end of the puller body extending to the outside of the puller body, the vacuum pump configured to extract the gas in the gas flow passage.

15. The single crystal pulling apparatus according to claim 14, wherein the single crystal pulling apparatus Hot-Zone structure further comprises:

a filtering device provided between the exhaust cylinder and the vacuum pump, and configured to filter impurity particles in the gas.

16. A crystal ingot, wherein the crystal ingot is manufactured by using the single crystal pulling apparatus according to claim 10.

* * * * *